(12) United States Patent
Cheng et al.

(10) Patent No.: US 10,643,516 B2
(45) Date of Patent: May 5, 2020

(54) DATA LINE DEMULTIPLEXER, DISPLAY SUBSTRATE, DISPLAY PANEL AND DISPLAY DEVICE

(71) Applicant: BOE TECHNOLOGY GROUP CO., LTD., Beijing (CN)

(72) Inventors: Hongfei Cheng, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 90 days.

(21) Appl. No.: 15/745,163

(22) PCT Filed: Jun. 23, 2017

(86) PCT No.: PCT/CN2017/089744
§ 371 (c)(1),
(2) Date: Jan. 16, 2018

(87) PCT Pub. No.: WO2018/090627
PCT Pub. Date: May 24, 2018

(65) Prior Publication Data
US 2019/0012947 A1    Jan. 10, 2019

(30) Foreign Application Priority Data
Nov. 15, 2016  (CN) .......................... 2016 2 1255505

(51) Int. Cl.
*G09G 3/3275*   (2016.01)
*G09G 3/20*     (2006.01)
(Continued)

(52) U.S. Cl.
CPC .............. *G09G 3/2003* (2013.01); *G09F 9/00* (2013.01); *G09G 3/3607* (2013.01);
(Continued)

(58) Field of Classification Search
CPC .. G09G 3/2003; G09G 3/3607; G09G 3/3688; G09G 3/3614; G09G 2310/0297;
(Continued)

(56) References Cited

U.S. PATENT DOCUMENTS

| | | |
|---|---|---|
| 7,075,507 B2 | 7/2006 | Ozawa et al. |
| 8,605,067 B2 | 12/2013 | Chen et al. |

(Continued)

FOREIGN PATENT DOCUMENTS

| | | |
|---|---|---|
| CN | 102184700 A | 9/2011 |
| CN | 103474035 A | 12/2013 |

(Continued)

OTHER PUBLICATIONS

Search Report for International Application No. PCT/CN2017/089744 dated Sep. 28, 2017.

*Primary Examiner* — Michael J Eurice
(74) *Attorney, Agent, or Firm* — Calfee, Halter & Griswold LLP (57) ABSTRACT

The disclosure relates to a data line demultiplexer, a display substrate, a display panel, and a display device. The data line demultiplexer includes a switching module, a plurality of switching signal terminals and a plurality of data signal terminals. The switching module is respectively connected to the plurality of switching signal terminals, the plurality of data signal terminals and M columns of pixel units in a display device. The switching module is capable of communicating each of the data signal terminals with at least two columns of sub-pixels under control of the plurality of switching signal terminals, wherein every two columns of sub-pixels that are connected with one data signal terminal are spaced apart by an odd number of columns of sub-pixels that are connected with other data signal terminals.

16 Claims, 3 Drawing Sheets

(51) Int. Cl.
*G09F 9/00* (2006.01)
*G09G 3/36* (2006.01)
*H01L 27/32* (2006.01)

(52) U.S. Cl.
CPC ......... *G09G 3/3688* (2013.01); *G09G 3/3275* (2013.01); *G09G 3/3614* (2013.01); *G09G 3/3648* (2013.01); *G09G 2300/0823* (2013.01); *G09G 2310/0235* (2013.01); *G09G 2310/0297* (2013.01); *G09G 2310/08* (2013.01); *G09G 2330/021* (2013.01); *H01L 27/3211* (2013.01)

(58) Field of Classification Search
CPC ........... G09G 2330/021; G09G 3/3275; G09G 3/3648; G09G 2300/0823; G09G 2310/0235; G09G 2310/08; G09F 9/00; H01L 27/3211
See application file for complete search history.

(56) References Cited

U.S. PATENT DOCUMENTS

| | | | |
|---|---|---|---|
| 9,552,786 B2 | 1/2017 | Shikata | |
| 2002/0067327 A1* | 6/2002 | Ozawa | G09G 3/3648 345/89 |
| 2003/0059525 A1* | 3/2003 | Moon | G09G 3/30 427/66 |
| 2003/0107537 A1* | 6/2003 | Ochi | G09G 3/2003 345/83 |
| 2007/0176869 A1* | 8/2007 | Fujita | G09G 3/3413 345/88 |
| 2009/0289878 A1* | 11/2009 | Chen | G09G 3/3688 345/87 |
| 2010/0013864 A1* | 1/2010 | Oelhafen | G09G 3/3688 345/690 |
| 2011/0090137 A1* | 4/2011 | Liu | G09G 3/3233 345/76 |
| 2012/0154358 A1* | 6/2012 | Chen | G09G 3/3614 345/209 |
| 2013/0063404 A1* | 3/2013 | Jamshidi Roudbari | G06F 3/044 345/204 |
| 2015/0186098 A1* | 7/2015 | Hall | H01H 11/04 345/1.3 |
| 2015/0279295 A1* | 10/2015 | Shikata | G09G 3/3607 345/694 |
| 2015/0279296 A1* | 10/2015 | Kim | G09G 3/3618 345/205 |
| 2017/0309230 A1* | 10/2017 | Kwon | G09G 3/3233 |
| 2017/0316747 A1* | 11/2017 | Matsueda | G09G 3/3607 |
| 2018/0033386 A1* | 2/2018 | Enami | G02F 1/13452 |
| 2018/0075798 A1* | 3/2018 | Nho | G09G 3/32 |
| 2018/0190195 A1* | 7/2018 | Asano | G09G 3/3233 |
| 2018/0348959 A1* | 12/2018 | Lin | G06F 3/0412 |
| 2019/0088207 A1* | 3/2019 | Lin | G09G 3/3275 |
| 2019/0088208 A1* | 3/2019 | Chang | G09G 3/3275 |
| 2019/0228726 A1* | 7/2019 | Ono | G09G 3/3225 |

FOREIGN PATENT DOCUMENTS

| | | | | |
|---|---|---|---|---|
| CN | 104952401 A | 9/2015 | | |
| CN | 105741809 A | 7/2016 | | |
| CN | 206194295 U | 5/2017 | | |
| EP | 1647967 A1 * | 4/2006 | ........... | G09G 3/3233 |
| JP | 2002169503 A | 6/2002 | | |

* cited by examiner

DATA LINE DEMULTIPLEXER, DISPLAY SUBSTRATE, DISPLAY PANEL AND DISPLAY DEVICE

CROSS-REFERENCE TO RELATED APPLICATIONS

This application is based on International Application No. PCT/CN2017/089744, filed on Jun. 23, 2017, and claims priority to Chinese Patent Application Serial No. 201621255505.3 filed with the State Intellectual Property Office of P. R. China on Nov. 15, 2016, the entire contents of which are incorporated herein by reference.

TECHNICAL FIELD

The present disclosure relates to the field of display technology, and more particularly, to a data line demultiplexer, a display substrate, a display panel and a display device.

BACKGROUND

The data line demultiplexer is a device in the display device for distributing data signals provided by the source driver circuit to each sub-pixel in the pixel unit.

In the related art, for a display device including three color sub-pixels for each pixel unit, the data line demultiplexer generally includes three switching signal terminals SW1 to SW3, m data signal terminals D1 to Dm, and 3×m transistors. In addition, the display device may also include a gate driving circuit for providing a gate driving signal to each sub-pixel in each pixel unit. The drain electrode of each transistor is connected to a column of sub-pixels. Each of the switching signal terminals is connected to a gate electrode of a transistor for driving sub-pixels of one color. For example, the switching signal terminal SW1 is connected to a gate electrode of a transistor for driving red sub-pixels, and the switching signal terminal SW2 is connected to a gate electrode of a transistor for driving green sub-pixels. Each data signal terminal is respectively connected to the source electrodes of the three adjacent transistors, and the drain electrodes of the three adjacent transistors are connected to sub-pixels belonging to the same pixel unit. Thus, the function of distributing m data signals to 3×m columns of sub-pixels can be achieved.

However, if the display device is driven in a column inversion manner, when the switching signal terminal SW1 inputs a high voltage to drive the red sub-pixels, the data signal input by each of the data signal terminals may be a positive voltage. When the switching signal terminal SW2 inputs a high voltage to drive the green sub-pixels, the data signal input by each data signal terminal needs to hop to the negative voltage. Further, when the blue sub-pixels are driven, the data signal input by each data signal terminal needs to hop to the positive voltage again. During the column inversion driving process, the voltage polarity of the data signal output by each data signal terminal needs to be inverted frequently, and thus the power consumption of the display device is relatively high.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

In a first aspect, there is provided a data line demultiplexer, including a switching module, a plurality of switching signal terminals and a plurality of data signal terminals;

wherein the switching module is respectively connected to the plurality of switching signal terminals, the plurality of data signal terminals and M columns of pixel units in a display device, each column of pixel units including N columns of sub-pixels, where M is a positive integer, and N is an integer greater than 1; and the switching module is capable of communicating each of the data signal terminals with at least two columns of sub-pixels under control of the plurality of switching signal terminals, wherein every two columns of sub-pixels that are connected with one data signal terminal are spaced apart by an odd number of columns of sub-pixels that are connected with other data signal terminals.

In one embodiment, every two columns of sub-pixels that are connected with one data signal terminal are spaced apart by one column of sub-pixels that are connected with other data signal terminals.

In one embodiment, the data line demultiplexer includes N switching signal terminals.

In one embodiment, the data line demultiplexer includes M data signal terminals.

In one embodiment, the switching module is capable of respectively communicating each of the data signal terminals with the N columns of sub-pixels under control of the plurality of switching signal terminals.

In one embodiment, the switching module includes k transistors, where k is the number of columns of sub-pixels in the display device; and each of the k transistors has a gate electrode connected to one switching signal terminal, a first electrode being connected to one data signal terminal, and a second electrode being connected to one column of sub-pixels.

In one embodiment, the k transistors can be divided into N groups and each group includes M transistors; and the gate electrodes of the M transistors in each group are connected to the same switching signal terminal, and the M columns of sub-pixels connected to the second electrodes of the M transistors in each group are sub-pixels of the same color.

In one embodiment, the data line demultiplexer includes N switching signal terminals; and the gate electrodes of transistors of any two groups are connected to different switching signal terminals, and the second electrodes of transistors of any two groups are connected to sub-pixels of different colors.

In one embodiment, the data line demultiplexer includes M data signal terminals;

each of the data signal terminals is respectively connected to the first electrodes of the N transistors of the k transistors, and two adjacent transistors of the N transistors are spaced apart by one transistor in the data line demultiplexer; and the second electrode of the ith transistor in the k transistors is connected to the ith column of sub-pixels, where i is a positive integer less than or equal to k.

In one embodiment, the data line demultiplexer includes M data signal terminals;

each of the data signal terminals is respectively connected to the first electrodes of N adjacent transistors of the k transistors; and among the N columns of sub-pixels connected to the second electrodes of the N adjacent transistors, every two columns of sub-pixels that are connected with one data signal terminal are spaced apart by one column of sub-pixels that are connected with other data signal terminals in the display device.

In one embodiment, each column of pixel units includes three columns of sub-pixels of different colors; and the data line demultiplexer includes three switching signal terminals.

In one embodiment, the k transistors are all N-type transistors.

In a second aspect, there is provided a display substrate, including the data line demultiplexer according to the first aspect.

In a third aspect, there is provided a display panel, including the display substrate according to the second aspect.

In a fourth aspect, there is provided a display device, including the display panel according to third aspect.

In a fifth aspect, there is provided a driving method for a data line demultiplexer, the data line demultiplexer including a switching module, a plurality of switching signal terminals, and a plurality of data signal terminals, the switching module being respectively connected to the plurality of switching signal terminals, the plurality of data signal terminals and M columns of pixel units in a display device, each column of pixel units including N columns of sub-pixels of different colors, where M is a positive integer, and N is an integer greater than 1; the switching module being capable of communicating each of the data signal terminals with at least two columns of sub-pixels under control of the plurality of switching signal terminals, every two columns of sub-pixels that are connected with one data signal terminal being spaced apart by an odd number of columns of sub-pixels that are connected with other data signal terminals, and the method including: during a process of displaying one frame of image, sequentially outputting, by the plurality of switching signal terminals, voltage signals for turning on corresponding transistors in the switching module, a voltage polarity of the data signal output by each of the plurality of data signal terminals remaining unchanged, and voltage polarities of data signals output by adjacent data signal terminals being opposite to each other; and when a next frame of image is displayed, changing the voltage polarity of the data signal output by each of the plurality of data signal terminals.

In one embodiment, during a process of displaying the next frame of image, the plurality of switching signal terminals sequentially output voltage signals that turn on corresponding transistors in the switching module.

In one embodiment, every two columns of sub-pixels that are connected with one data signal terminal are spaced apart by one column of sub-pixels that are connected with other data signal terminals.

In one embodiment, the switching module includes k transistors, where k is the number of columns of sub-pixels in the display device, and each of the k transistors has a gate electrode being connected to one switching signal terminal, a first electrode being connected to one data signal terminal, and a second electrode connected to one column of sub-pixels.

In one embodiment, the k transistors can be divided into N groups and each group includes M transistors; and the gate electrodes of the M transistors in each group are connected to the same switching signal terminal, and the M columns of sub-pixels connected to the second electrodes of the M transistors in each group are sub-pixels of the same color.

The technical solutions provided by the present disclosure can bring about the following beneficial effects.

In the data line demultiplexer provided by the embodiment of the present disclosure, the switching module may communicate each data signal terminal with at least two columns of sub-pixels under the control of a plurality of switching signal terminals. Of the at least two columns of sub-pixels, every two columns of sub-pixels that are connected with one data signal terminal are spaced apart by an odd number of columns of sub-pixels that are connected with other data signal terminals. Since during column inversion driving process, the polarities of two columns of sub-pixels which are spaced apart by an odd number of columns are the same, when each data signal terminal drives at least two columns of sub-pixels communicated thereto, the column inversion driving can be realized without inverting the voltage polarity of the data signal, and the power consumption of the display device in the driving process is low.

BRIEF DESCRIPTION OF THE DRAWINGS

The specific aspects of the present disclosure, which are illustrated by the accompanying drawings to be described below, will be described in detail below. These accompanying drawings and description are not intended to limit the scope of the present disclosure in any manner, but to explain the concept of the present disclosure to those skilled in the art via referencing specific aspects.

DETAILED DESCRIPTION

To make the objectives, technical solutions, and advantages of the present disclosure more comprehensible, the embodiments of the present disclosure are further described in detail below with reference to the accompanying drawings.

The transistors employed in the embodiments of the present disclosure may all be thin film transistors, field effect transistors, or other devices with the same characteristics. Depending on the function in the circuit, the transistors employed in the embodiments of the present disclosure are mainly switching transistors. As used herein, a source electrode and a drain electrode of the switching transistor are symmetrical, and therefore the source electrode and the drain electrode are interchangeable. In the embodiments of the present disclosure, the source electrode is referred to as a first stage and the drain electrode is referred to as a second stage. According to the form in the figures, an intermediate terminal of the transistor is a gate electrode, a signal input terminal of the transistor is a source electrode, and a signal output terminal of the transistor is a drain electrode. In addition, the switching transistor employed in the embodiments of the present disclosure includes two types of switching transistors: a P-type switching transistor that is turned on when the gate electrode is at a low voltage and turned off when the gate electrode is at a high voltage, and an N-type switching transistor that is turned on when the gate electrode is at a high voltage and turned off when the gate electrode is at a low voltage.

Figure 1:
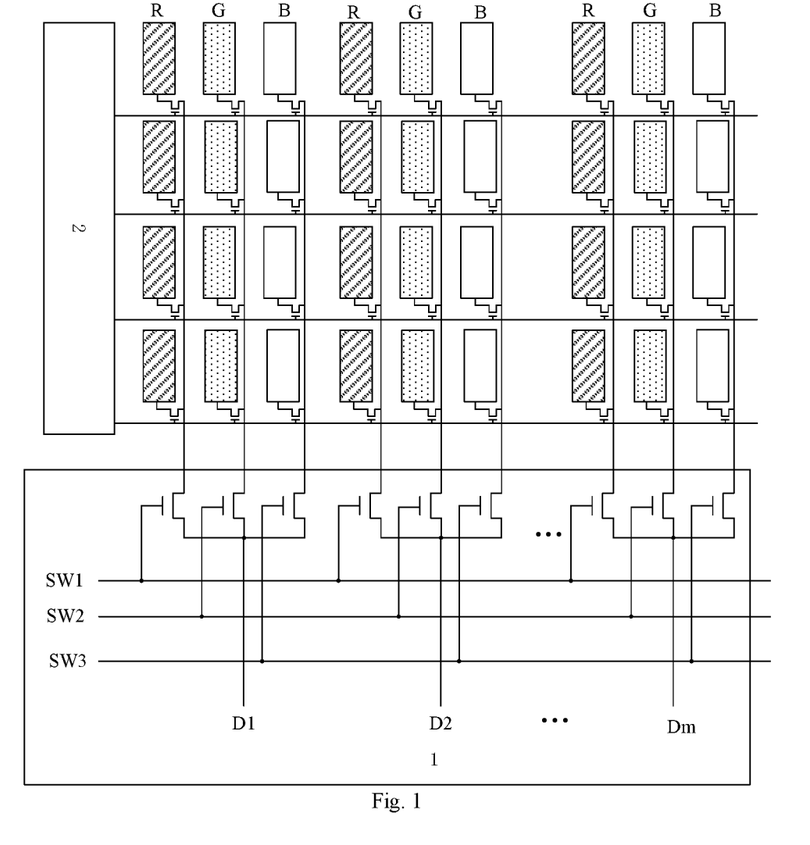
FIG. 1 is a schematic structural diagram of a data line demultiplexer in the related art.
Figure 2:
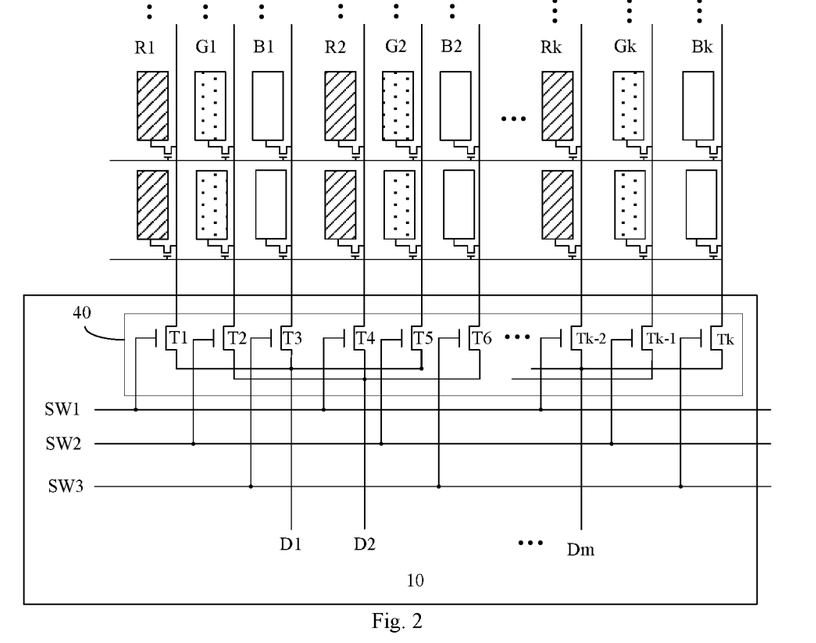
FIG. 2 is a schematic structural diagram of a data line demultiplexer according to an embodiment of the present disclosure.

FIG. 1 is a schematic structural diagram of a data line demultiplexer in the related art. As shown in FIG. 1, for a display device including three color sub-pixels for each pixel unit, the data line demultiplexer 1 generally includes three switching signal terminals SW1 to SW3, m data signal terminals D1 to Dm, and 3×m transistors. In addition, as shown in FIG. 1, the display device may also include a gate driving circuit 2 for providing a gate driving signal to each sub-pixel in each pixel unit. The present disclosure provides a data line demultiplexer 10. Referring to FIG. 2, the data line demultiplexer 10 may include a switching module 40, a plurality of switching signal terminals, and a plurality of data signal terminals. For example, in FIG. 2, the data line demultiplexer includes three switching signal terminals SW1, SW2, and SW3, and M data signal terminals D1, D2 to Dm.

The switching module 40 is respectively connected to the plurality of switching signal terminals, the plurality of data signal terminals and the M columns of pixel units in the display device. Each column of pixel units may include N columns of sub-pixels of different colors, where M is a positive integer, and N is an integer greater than one.

The switching module 40 is capable of communicating each of the data signal terminals with at least two columns of sub-pixels under the control of the plurality of switching signal terminals. Of the at least two columns of sub-pixels, two adjacent columns of sub-pixels are spaced apart by an odd number of columns of sub-pixels in the display device. Here, the two adjacent columns of sub-pixels refer to two columns of sub-pixels in communication with the same data signal terminal and are nearest to each other.

For example, as shown in FIG. 2, the data signal terminal D1 may be connected to the three sub-pixels R1, B1, and G2 through the switching module 40 respectively. Among the three columns of sub-pixels, the sub-pixels R1 and B1 are the nearest to each other and are two adjacent columns of sub-pixels, and the two adjacent columns of sub-pixels R1 and B1 are spaced apart by one column of sub-pixels G1 in the display device. The other two adjacent columns of sub-pixels B1 and G2 are spaced apart by one column of sub-pixels R2 in the display device. Since during column inversion driving process, the polarities of the three sub-pixels R1, B1 and G2 are the same, the data signal terminal D1 that is in communication with the three sub-pixels may keep the voltage polarity of the output data signal unchanged during column inversion driving process. The voltage polarity is relative to the common voltage. When the signal voltage is higher than the common voltage, the signal voltage is called a positive voltage. When the signal voltage is lower than the common voltage, the signal voltage is called a negative voltage.

In summary, in the data line demultiplexer 10 provided by the embodiment of the present disclosure, the switching module may communicate each data signal terminal with at least two columns of sub-pixels under the control of a plurality of switching signal terminals. Of the at least two columns of sub-pixels, two adjacent columns of sub-pixels are spaced apart by an odd number of columns of sub-pixels in the display device. Since during column inversion driving process, the polarities of two columns of sub-pixels which are spaced apart by an odd number of columns are the same, when each data signal terminal drives at least two columns of sub-pixels communicated thereto, the column inversion driving can be realized without inverting the voltage polarity of the data signal, and the power consumption of the display device in the driving process is low.

In an embodiment, in at least two columns of sub-pixels communicated with each data signal terminal, two adjacent columns of sub-pixels in the display device may be spaced apart by only one column of sub-pixels. For example, as shown in FIG. 2, in the three columns of sub-pixels R1, B1, and G2 in which the data signal terminal D1 is communicated through the switching module 40, only one column of sub-pixels G1 may be disposed between two adjacent columns of sub-pixels R1 and B1, and only one column of sub-pixels R2 may be disposed between the two adjacent columns of sub-pixels B1 and G2.

In practical application, reducing the interval between at least two sub-pixels communicated to each data signal terminal avoids excessively long traces between the switching module and the pixel unit and reduces the manufacturing cost.

In an embodiment, in the disclosed embodiment, the data line demultiplexer 10 may include N switching signal terminals. That is, the number N of switching signal terminals in the data line demultiplexer 10 may be the same as the number of sub-pixels included in each pixel unit in the display device. For example, referring to FIG. 2, in the display device where the data line demultiplexer 10 is located, each pixel unit includes sub-pixels of three colors of red, green and blue, that is, N=3. Correspondingly, the data line demultiplexer may include three switching signal terminals SW1, SW2, and SW3.

Further, M data signal terminals may be included in the data line demultiplexer 10. That is, the number M of the data signal terminals in the data line demultiplexer 10 may be the same as the number of columns of pixel units included in the display device.

In the embodiment of the present disclosure, if the data line demultiplexer 10 includes M data signal terminals, since the display device includes M columns of pixel units and each column of pixel units further includes N columns of sub-pixels, in order to make the M data signal terminals uniformly provide data signals for the M×N sub-pixels, the switching module 40 may respectively communicate each data signal terminal and N sub-pixels under the control of the plurality of switching signal terminals.

For example, in FIG. 2, each pixel unit includes three sub-pixels. Then, the switching module 40 may communicate each data signal terminal with three columns of sub-pixels, for example, communicate the data signal terminal D1 with the column of sub-pixels R1, the column of sub-pixels B1 and the column of sub-pixels G2. In the data line demultiplexer 20 shown in FIG. 3, since each pixel unit only includes two sub-pixels, the switching module 40 may communicate each data signal terminal to two columns of sub-pixels. For example, the data signal terminal D1 may be communicated with the column of sub-pixels R1 and the column of sub-pixels R2 respectively, and the data signal terminal D2 may be communicated with the column of sub-pixels G1 and the column of sub-pixels G2 respectively.

Figure 3:
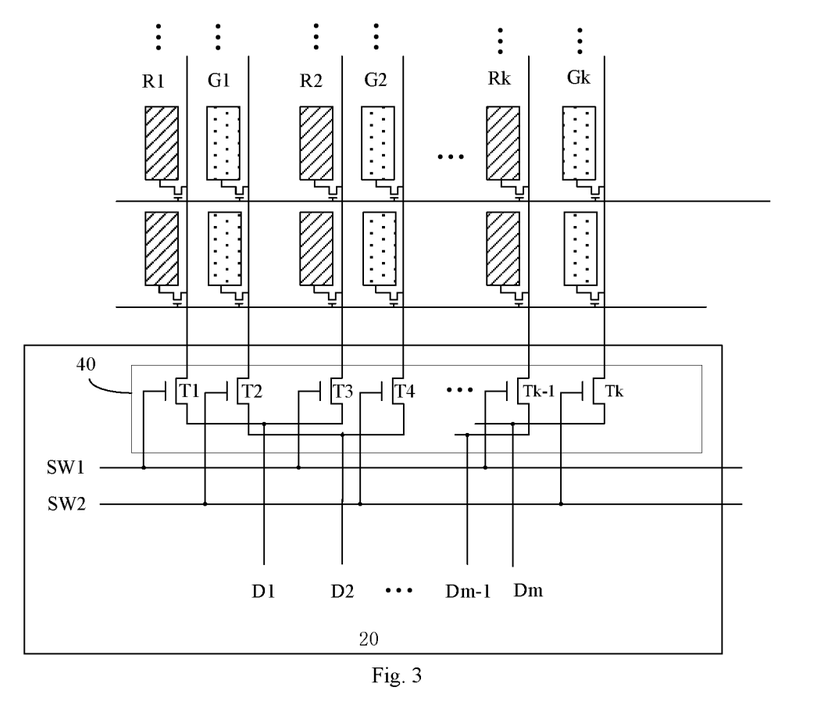
FIG. 3 is a schematic structural diagram of another data line demultiplexer according to an embodiment of the present disclosure.

Referring to FIGS. 2 and 3, in the data line demultiplexer provided by the embodiment of the present disclosure, the switching module 40 may include k transistors, where k may be the number of columns of sub-pixels in the display device, that is, k satisfies: k=M×N.

Each of the k transistors has a gate electrode connected to a switching signal terminal, with a first electrode being connected to a data signal terminal, and a second electrode being connected to a column of sub-pixels. For example, in FIG. 2, the gate electrode of the transistor T1 is connected to the switching signal terminal SW1, and the first electrode is connected to the data signal terminal D1, and the second electrode is connected to the column of sub-pixels R1.

In the embodiment of the present disclosure, the k transistors may be divided into N groups, and each group includes M transistors. The gate electrodes of the M transistors in each group are connected to the same switching signal terminal, and the second electrodes of the M transistors in each group are connected to M columns of sub-pixels of the same color.

Further, if the data line demultiplexer includes N switching signal terminals, the switching signal terminals connected to the gate electrodes of any two groups of transistors are different, and the colors of the sub-pixels connected to the second electrodes of any two groups of transistors are different. That is, each switching signal terminal controls only sub-pixels of one color, and sub-pixels of N colors are controlled by the N switching signal terminals.

For example, referring to FIG. 2, the k transistors may be divided into three groups, where the first group may include M transistors T1, T4 to Tk–2, and the second group may include M transistors T2, T5 to Tk–1, and the third group may include M transistors T3, T6 to Tk.

In the three groups of transistors, the gate electrodes of the M transistors in the first group are all connected to the switching signal terminal SW1, the second electrodes thereof are all connected to the red sub-pixels, and the switching signal terminal SW1 may control all of the red sub-pixels through the M transistors of the first group. The gate electrodes of the M transistors in the second group are all connected to the switching signal terminal SW2, the second electrodes thereof are all connected to the green sub-pixels, and the switching signal terminal SW2 may control all of the green sub-pixels through the M transistors of the second group. The gate electrodes of the M transistors in the third group are all connected to the switching signal terminal SW3, the second electrodes thereof are all connected to the blue sub-pixels, and the switching signal terminal SW3 may control all of the blue sub-pixels through the M transistors of the third group.

As an optional implementation of the present disclosure, referring to FIG. 2, the data line demultiplexer 10 may include M data signal terminals.

Each of the data signal terminals is respectively connected to the first electrodes of the N transistors of the k transistors, and two adjacent transistors of the N transistors are spaced apart by one transistor in the data line demultiplexer 10. The second electrode of the $i^{th}$ transistor in the k transistors is connected to the $i^{th}$ column of sub-pixels, where i is a positive integer less than or equal to k. Two adjacent transistors refer to two nearest transistors among the N transistors connected to the same data signal terminal.

For example, referring to FIG. 2, the data signal terminal D1 is respectively connected to the first electrodes of the three transistors T1, T3 and T5. Among the three transistors, transistors T1 and T3 are the nearest and are two adjacent transistors. The two adjacent transistors T1 and T3 are spaced apart by one transistor T2 in the data line demultiplexer 10. The other two adjacent transistors T3 and T5 among the three transistors are spaced apart by one transistor T4 in the data line demultiplexer 10. Furthermore, as may also be seen from FIG. 2, the second electrodes of the k transistors are sequentially connected to the corresponding columns of sub-pixels. That is, the second electrode of the first transistor T1 is connected to the first column of sub-pixels R1, and the second electrode of the second transistor T2 is connected to the second column of sub-pixels B1. As a result, it can be realized that N columns of sub-pixels communicated with the same data signal terminal are columns of sub-pixels disposed spaced apart.

Figure 4:
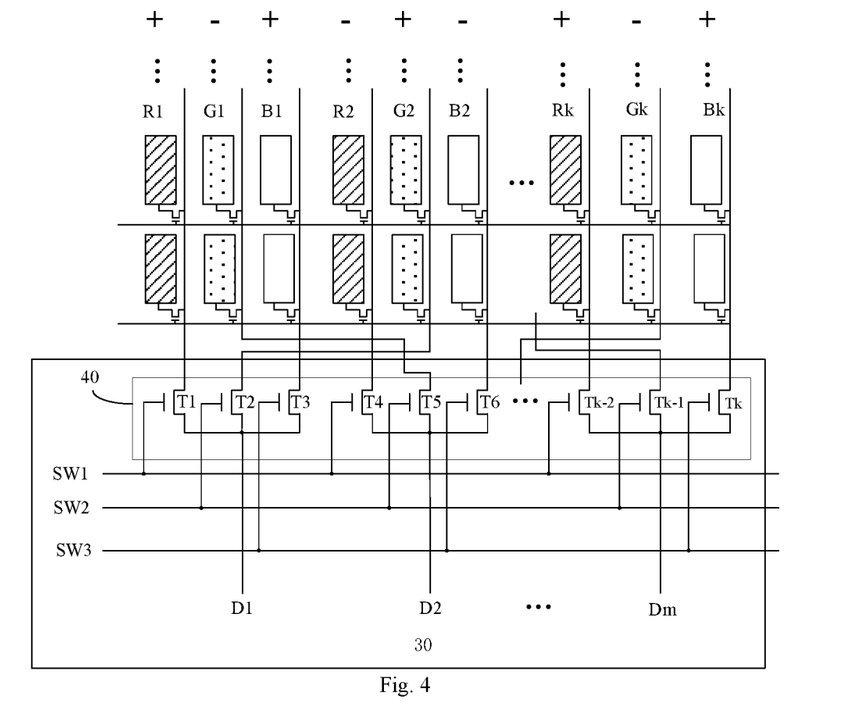
FIG. 4 is a schematic structural diagram of still another data line demultiplexer according to an embodiment of the present disclosure.

As another optional implementation of the present disclosure, referring to FIG. 4, the data line demultiplexer 30 may include M data signal terminals.

Each of the data signal terminals is respectively connected to the first electrodes of N adjacent transistors in the k transistors, and of the N columns of sub-pixels connected to the second electrodes of the N adjacent transistors, wherein two adjacent columns of sub-pixels are spaced apart by one column of sub-pixels in the display device.

For example, referring to FIG. 4, the data signal terminal D1 is respectively connected to the first electrodes of the three adjacent transistors T1, T2 and T3. The sub-pixels connected to the second electrode of the transistor T1 are the column of sub-pixels R1, the sub-pixels connected to the second electrode of the transistor T2 are the column of sub-pixels G2, and the sub-pixels connected to the second electrode of T3 are the column of sub-pixels B1. In the three columns of sub-pixels R1, B1, and G2, two adjacent columns of sub-pixels R1 and B1 in the display device are spaced apart by one column of sub-pixels G1 and two adjacent columns of sub-pixels B1 and G2 are spaced apart by one column of sub-pixels R2 in the display device. As a result, it can be realized that N columns of sub-pixels communicated with the same data signal terminal are columns of sub-pixels disposed spaced apart.

When the display device is driven in the column inversion manner, the voltages stored in the sub-pixels of the same column have the same polarity during the driving of one frame of image, and the voltages stored in the sub-pixels of two adjacent columns have opposite polarities. In the next frame, the voltage polarities stored in the sub-pixels of each column are opposite to the polarities stored in the sub-pixels of that column for the previous frame. For example, in FIG. 4, the voltage polarities of the column of sub-pixels R1 and of the column of sub-pixels G1 are opposite to each other, and the voltage polarities of the column of sub-pixels G1 and of the column of sub-pixels B1 are opposite to each other. However, the polarities of sub-pixels spaced apart by an odd number of columns of sub-pixels are the same. For example, the column of sub-pixels R1, the column of sub-pixels B1 and the column of sub-pixels G2 are all positive polarity. If the data line demultiplexer as shown in any one of FIG. 2 to FIG. 4 is employed to provide a data signal for the pixel unit, since the columns of sub-pixels communicated with each data signal terminal are columns of sub-pixels spaced apart, the columns of sub-pixels spaced apart have the same polarity. Therefore, when driving in the column inversion manner, the polarity of the data signal output by each data signal terminal may be maintained during the display of one frame of image. For example, the positive voltage or the negative voltage may be maintained without the need for inverting the polarity of the voltage, thereby reducing the power consumption of the display device.

In an embodiment, in the embodiments of the present disclosure, the k transistors may all be N-type transistors. However, the k transistors may also be P-type transistors. The embodiments of the present disclosure do not limit the specific type of the transistors.

Figure 5:
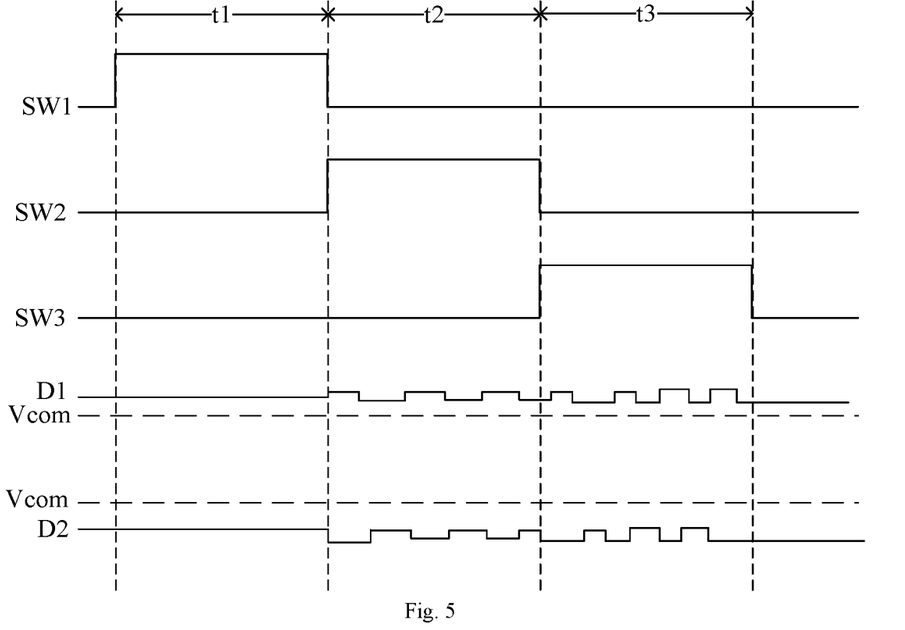
FIG. 5 is a driving timing diagram of a data line demultiplexer according to an embodiment of the present disclosure.

Referring to FIG. 5, a timing diagram of a driving process of a data line demultiplexer according to an embodiment of the present disclosure is shown. Referring to FIG. 5, during the display of one frame of image, the driving process may include three stages. In the first stage t1, the switching signal output by the switching signal terminal SW1 is at a high voltage. At this time, referring to FIG. 2 and FIG. 4, the first group of transistors T1, T4 to Tk-2 connected to the red sub-pixels is turned on, and the data signal terminals D1 to Dm respectively input data signals to corresponding sub-pixels through the first group of transistors.

If the display device is driven in the column inversion manner, referring to FIGS. 2 and 4, the data voltages stored in the columns of sub-pixels R1, B1, G2 to Bk in the display device need to be positive voltage; and the data voltages stored in the columns of sub-pixels G1, R2, B2 to Gk need to be negative voltage. For the structure shown in FIG. 2 and FIG. 4, referring to FIG. 5, the voltages of the data signals output by the data signal terminal D1 that is in communication with the column of sub-pixels R1 and the data signal terminal Dm that is in communication with the column of sub-pixels Rk may be positive voltages (the positive voltage is higher than the common voltage Vcom), and the voltage of the data signal output by the data signal terminal D2 that is in communication with the column of sub-pixels R2 may be a negative voltage (the negative voltage is lower than the common voltage Vcom).

In the second stage t2, the switching signal output by the switching signal terminal SW2 is at a high voltage. At this time, referring to FIG. 2 and FIG. 4, the second group of transistors T2, T5 to Tk-1 connected to the green sub-pixel are turned on. Since the display device is driven in a column inversion manner, for the structure shown in FIGS. 2 and 4, referring to FIG. 5, the data signals output by the data signal terminal D1 that is in communication with the column of sub-pixels G2 and the data signal terminal Dm that is in communication with the column of sub-pixels Gk-1 may keep the positive voltages, and data signal output by the data signal terminal D2 that is in communication with the column of sub-pixels G1 may keep the negative voltage.

In the third stage t3, the switching signal output by the switching signal terminal SW3 is at a high voltage. At this time, referring to FIG. 2 and FIG. 4, the second group of transistors T3, T6 to Tk connected to the blue sub-pixels are turned on. At this time, the data signals output by the data signal terminal D1 that is in communication with the column of sub-pixels B1 and the data signal terminal Dm that is in communication with the column of sub-pixels Bk may keep the positive voltages, and data signal output by the data signal terminal D2 that is in communication with the column of sub-pixels B2 may keep the negative voltage.

It should be noted that, referring to FIG. 5, when the sub-pixels of different colors are driven, the voltage level of the data signal output by each data signal terminal may change, but the voltage polarity of the data signal output by each data signal terminal will keep unchanged. For example, the voltage of the data signal output by the data signal terminal D1 in FIG. 5 always maintains the positive polarity, and the voltage of the data signal output by the data signal terminal D2 always maintains the negative polarity.

However, in practical application, when sub-pixels of the same color are driven, the levels of the data voltages of the sub-pixels in different display rows but in the same column may also be different. That is, at each stage, the voltage of the data signal output by the data signal terminal may have different level but have the same polarity. For example, as shown in FIG. 5, in the first stage t1 shown in FIG. 5, the voltage levels of the data signals of the sub-pixels in different display rows but in the same column are the same; in the second stage t2, the voltage levels of the data signals of the sub-pixels in different display rows but in the same column are different; and in the third stage t3, the voltage levels of the data signals of the sub-pixels in different display rows but in the same column are also different. The embodiments of the present disclosure do not specifically limit the voltage level of the data signal output by each data signal terminal in each stage as long as it is ensured that the voltage polarity of the data signal outputted by each data signal terminal is maintained unchanged during the display of one frame of image.

According to the above analysis, when the data line demultiplexer according to the embodiments of the present disclosure drives the display device in the column inversion manner, the voltage polarity of the data signal output by each data signal terminal during display of one frame of image may be maintained unchanged, and the voltage polarity of the data signal may hop only once, only when displaying the next frame of image, thereby, effectively reducing the number of changes of the voltage polarities of the data signals and reducing the power consumption of the display device.

In summary, in the data line demultiplexer provided by the embodiment of the present disclosure, the switching module may communicate each data signal terminal with at least two columns of sub-pixels under the control of a plurality of switching signal terminals. Of the at least two columns of sub-pixels, two adjacent columns of sub-pixels are spaced apart by an odd number of columns of sub-pixels in the display device. Since during column inversion driving process, the polarities of two columns of sub-pixels which are spaced apart by an odd number of columns are the same, when each data signal terminal drives at least two columns of sub-pixels communicated thereto, the column inversion driving can be realized without inverting the voltage polarity of the data signal, and the power consumption of the display device in the driving process is low.

An embodiment of the present disclosure also provides a display substrate, which may include a data line multiplexer as shown in any one of FIG. 2 to FIG. 4.

Further, an embodiment of the present disclosure also provides a display panel, which may include a display substrate provided with a data line demultiplexer as shown in any one of FIGS. 2 to 4.

Further, an embodiment of the present disclosure also provides a display device, which includes: a display panel in which a display substrate may include a data line demultiplexer as shown in any one of FIGS. 2 to 4. The display device may be any product or component having a display function such as a liquid crystal panel, an electronic paper, an OkED panel, an AMOkED panel, a cell phone, a tablet computer, a television, a display, a notebook computer, a digital photo frame and a navigator, etc.

It should be noted that the display device may also include a source driver circuit, which may be connected to the data signal terminals of the data line demultiplexer shown in any one of FIG. 2 to FIG. 4, so as to provide a data signal to each pixel unit in the display device through the data line demultiplexer.

The above is only preferred embodiments of the present disclosure and is not intended to limit the present disclosure. Any modifications, equivalent substitutions, improvements, etc. within the spirit and principle of the present disclosure should fall in the protection scope of the present disclosure.

What is claimed is:

1. A data line demultiplexer, comprising a switching module, a plurality of switching signal terminals and a plurality of data signal terminals, wherein
the switching module is respectively connected to the plurality of switching signal terminals, the plurality of data signal terminals and M columns of pixel units in a display device, each column of pixel units comprising N columns of sub-pixels, where M is a positive integer, and N is an integer greater than 1;

any two adjacent columns of sub-pixels are controlled by different switching signal terminals, and the switching module selectively communicates each of the data signal terminals with at least two columns of sub-pixels under control of the plurality of switching signal terminals, wherein every two columns of sub-pixels that are connected with one data signal terminal are spaced apart by an odd number of columns of sub-pixels;

the switching module comprises k transistors, where k is the number of columns of sub-pixels in the display device; and each of the k transistors has a gate electrode connected to one switching signal terminal, a first electrode connected to one data signal terminal, and a second electrode connected to one column of sub-pixels; and the k transistors are divided into N groups and each group comprises M transistors; and the gate electrodes of the M transistors in each group are connected to the same switching signal terminal, and the M columns of sub-pixels are connected to the second electrodes of the M transistors in each group are sub-pixels of the same color.

2. The data line demultiplexer according to claim 1, wherein every two columns of sub-pixels that are connected with one data signal terminal are spaced apart by one column of sub-pixels that are connected with other data signal terminals.

3. The data line demultiplexer according to claim 1, wherein the data line demultiplexer comprises N switching signal terminals.

4. The data line demultiplexer according to claim 1, wherein
each column of pixel units comprises three columns of sub-pixels of different colors; and
the data line demultiplexer comprises three switching signal terminals.

5. The data line demultiplexer according to claim 1, wherein
the k transistors are all N-type transistors.

6. The data line demultiplexer according to claim 1, wherein the data line demultiplexer comprises M data signal terminals.

7. The data line demultiplexer according to claim 6, wherein the switching module selectively and respectively communicates each of the data signal terminals with the N columns of sub-pixels under control of the plurality of switching signal terminals.

8. The data line demultiplexer according to claim 1, wherein the data line demultiplexer comprises N switching signal terminals; and
the gate electrodes of transistors of any two groups are connected to different switching signal terminals, and the second electrodes of transistors of any two groups are connected to sub-pixels of different colors.

9. The data line demultiplexer according to claim 8, wherein
the data line demultiplexer comprises M data signal terminals;
each of the data signal terminals is respectively connected to the first electrodes of the N transistors of the k transistors, and two adjacent transistors of the N transistors are spaced apart by one transistor in the data line demultiplexer; and
the second electrode of the $i^{th}$ transistor in the k transistors is connected to the $i^{th}$ column of sub-pixels, where i is a positive integer less than or equal to k.

10. The data line demultiplexer according to claim 8, wherein
the data line demultiplexer comprises M data signal terminals;
each of the data signal terminals is respectively connected to the first electrodes of N adjacent transistors of the k transistors; and
among the N columns of sub-pixels connected to the second electrodes of the N adjacent transistors, every two columns of sub-pixels that are connected with one data signal terminal are spaced apart by one column of sub-pixels that are connected with other data signal terminals.

11. A display substrate, comprising the data line demultiplexer according to claim 1.

12. A display panel, comprising the display substrate according to claim 11.

13. A display device, comprising the display panel according to claim 12.

14. A driving method for a data line demultiplexer, the data line demultiplexer comprising a switching module, a plurality of switching signal terminals, and a plurality of data signal terminals, wherein the switching module is respectively connected to the plurality of switching signal terminals, the plurality of data signal terminals and M columns of pixel units in a display device, each column of pixel units comprises N columns of sub-pixels of different colors, where M is a positive integer, and N is an integer greater than 1; any two adjacent columns of sub-pixels are controlled by different switching signal terminals, and the switching module selectively communicates each of the data signal terminals with at least two columns of sub-pixels under control of the plurality of switching signal terminals, every two columns of sub-pixels that are connected with one data signal terminal are spaced apart by an odd number of columns of sub-pixels; the switching module comprises k transistors, where k is the number of columns of sub-pixels in the display device, and each of the k transistors has a gate electrode connected to one switching signal terminal, a first electrode connected to one data signal terminal, and a second electrode connected to one column of sub-pixels; and the k transistors are divided into N groups and each group comprises M transistors, the gate electrodes of the M transistors in each group are connected to the same switching signal terminal, and the M columns of sub-pixels connected to the second electrodes of the M transistors in each group are sub-pixels of the same color, and the method comprising:
during a process of displaying one frame of image, sequentially outputting, by the plurality of switching signal terminals, voltage signals for turning on corresponding transistors in the switching module, a voltage polarity of the data signal output by each of the plurality of data signal terminals remaining unchanged, and voltage polarities of data signals output by adjacent data signal terminals being opposite to each other; and
when a next frame of image is displayed, changing the voltage polarity of the data signal output by each of the plurality of data signal terminals.

15. The driving method according to claim 14, wherein during a process of displaying the next frame of image, the plurality of switching signal terminals sequentially output voltage signals that turn on corresponding transistors in the switching module.

16. The driving method according to claim 14, wherein every two columns of sub-pixels that are connected with one data signal terminal are spaced apart by one column of sub-pixels that are connected with other data signal terminals.

* * * * *